(12) United States Patent
Sasaki et al.

(10) Patent No.: US 8,426,962 B2
(45) Date of Patent: Apr. 23, 2013

(54) SEMICONDUCTOR DEVICE

(75) Inventors: Taishi Sasaki, Tokyo (JP); Tsuyoshi Takayama, Tokyo (JP); Mikio Ishihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/112,385

(22) Filed: May 20, 2011

(65) Prior Publication Data

US 2012/0091573 A1    Apr. 19, 2012

(30) Foreign Application Priority Data

Oct. 13, 2010    (JP) .................................. 2010-230190

(51) Int. Cl.
*H01L 23/34*    (2006.01)
(52) U.S. Cl.
USPC .................................... 257/717; 257/E23.08
(58) Field of Classification Search .......................... None
See application file for complete search history.

(56) References Cited

U.S. PATENT DOCUMENTS

2004/0037043 A1* 2/2004 Ku ................................. 361/718
2006/0188727 A1* 8/2006 Ito et al. ......................... 428/413

FOREIGN PATENT DOCUMENTS

| DE | 27 55 404 A1 | 6/1979 |
|---|---|---|
| JP | 2003-168769 | 6/2003 |
| JP | 2005-268514 | 9/2005 |
| JP | 2008-42039 | 2/2008 |
| JP | 2008-300379 A | 12/2008 |
| JP | 2009-026957 | 2/2009 |
| JP | 2010-199494 | 9/2010 |
| WO | WO 2009/150995 A1 | 12/2009 |

OTHER PUBLICATIONS

Office Action issued Nov. 9, 2012 in German Patent Application No. 10 2011 081 514.7 with English language translation.
Korean Office Action mailed Jan. 17, 2013 in Korean Patent Application No. 10-2011-0101018 (with partial English translation).

\* cited by examiner

*Primary Examiner* — Fernando L Toledo
*Assistant Examiner* — Valerie N Newton
(74) *Attorney, Agent, or Firm* — Oblon, Spivak, McClelland, Maier & Neustadt, L.L.P.

(57) ABSTRACT

Provided is a semiconductor device including a heat dissipating fin; an insulating sheet bonded to an upper surface of the heat dissipating fin, with a part of the upper surface being exposed; a heat spreader located on the insulating sheet; a power element located on the heat spreader; and a transfer molding resin located to cover a predetermined surface including the part of the upper surface of the heat dissipating fin, the insulating sheet, the heat spreader and the power element, wherein the upper surface of the heat dissipating fin has a protruding shape and/or recessed shape located so as to bind an edge of the insulating sheet.

6 Claims, 8 Drawing Sheets

F I G . 3
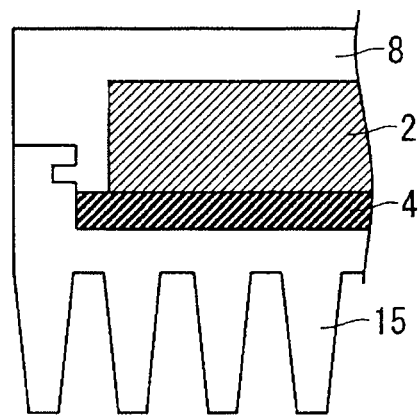

US 8,426,962 B2
SEMICONDUCTOR DEVICE

BACKGROUND OF THE INVENTION

1. Field of the Invention

The present invention relates to the structure of a power module type semiconductor device.

2. Description of the Background Art

In conventional power module semiconductor devices, a semiconductor package unit including power elements and a heat dissipating fin for dissipating the heat generated from the power elements are separately provided.

In order to closely bond the semiconductor package unit and the heat dissipating fin to each other, for example, Japanese Patent Application Laid-Open No. 2008-42039 describes that grease or the like is applied therebetween and that holes for fastening are provided in the semiconductor package unit for closely bonding the semiconductor package unit to the heat dissipating fin.

Even semiconductor devices having the above-mentioned configuration are incapable of obtaining sufficiently high adhesion between the semiconductor package unit and the heat dissipating fin, which makes it difficult to obtain sufficient heat dissipation.

SUMMARY OF THE INVENTION

An object of the present invention is to provide a semiconductor device capable of sufficiently enhancing the adhesion between a semiconductor package unit and a heat dissipating fin and enhancing heat dissipation.

A semiconductor device according to the present invention includes: at least one heat dissipating fin; an insulating sheet bonded to an upper surface of the at least one heat dissipating fin, with a part of the upper surface being exposed; a heat spreader located on the insulating sheet; a power element located on the heat spreader; and a transfer molding resin located to cover a predetermined surface including the upper surface of the at least one heat dissipating fin, the insulating sheet, the heat spreader and the power element. The upper surface of the at least one heat dissipating fin has a protruding shape and/or recessed shape located so as to bind an edge of the insulating sheet.

According to the semiconductor device of the present invention, the insulating sheet can be temporarily fixed, which enables to improve the accuracy in positioning and fixing the heat dissipating fin and the transfer molding resin. Therefore, it is possible to enhance the adhesion between the semiconductor package unit and the heat dissipating fin and enhance heat dissipation.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a partial cross-sectional view of the semiconductor device according to the first preferred embodiment;

DESCRIPTION OF THE PREFERRED EMBODIMENTS

Figure 7:
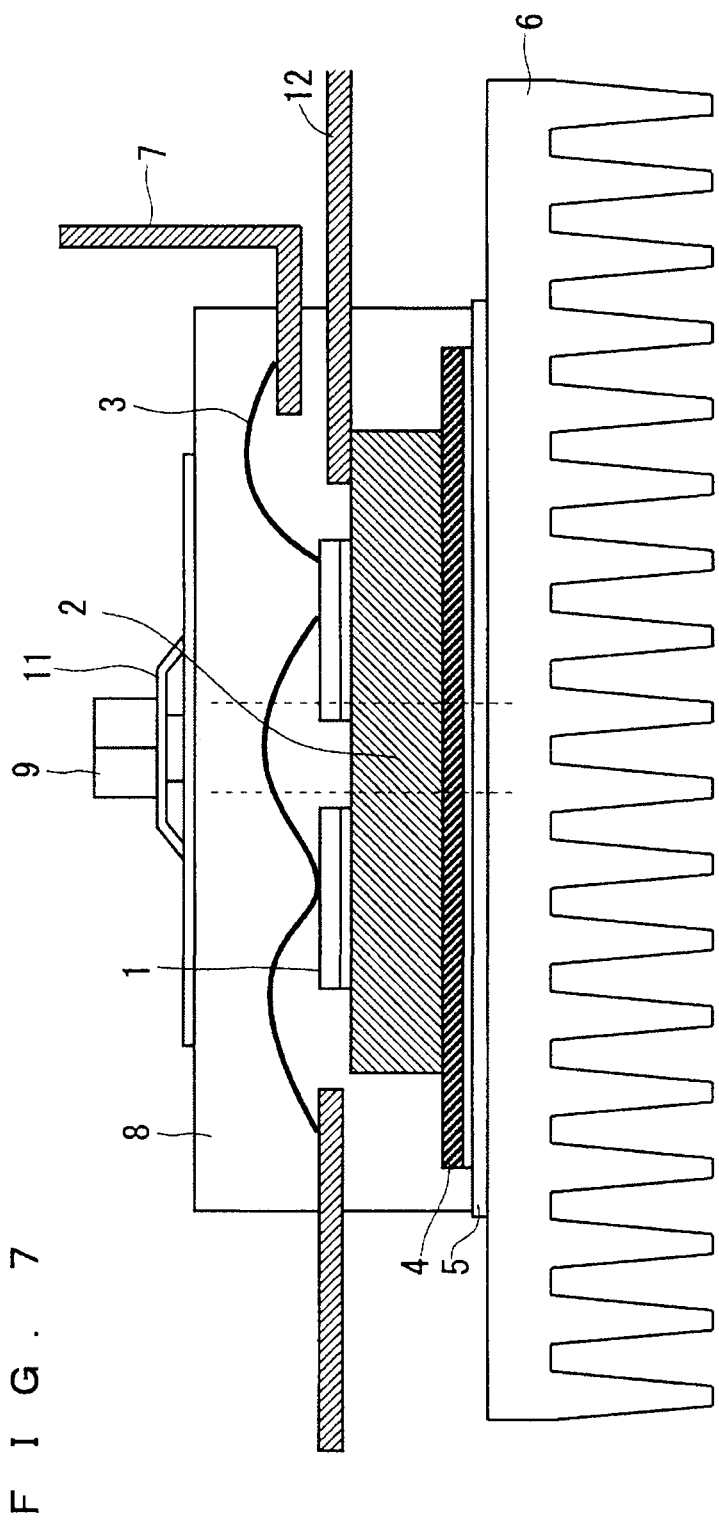
FIGS. 7 to 9 are cross-sectional views of a semiconductor device according to the underlying technology.

FIG. 7 is a cross-sectional view showing a first semiconductor device according to the underlying technology of the present invention.

In this semiconductor device, a plurality of power elements 1 are provided on a heat spreader 2 and are connected to a signal terminal 7 and a main terminal 12 via aluminum wires 3. The heat spreader 2 is disposed on an insulating sheet 4, and further, the insulating sheet 4 is bonded to a heat dissipating fin 6 through grease 5.

The power elements 1, heat spreader 2, aluminum wires 3, insulating sheet 4, and grease 5 are covered with a transfer molding resin 8 (epoxy resin). Further, a screw 9 passes through the transfer molding resin 8 to reach the heat dissipating fin 6 via a screw hole provided in the transfer molding resin 8 and a plate spring 11, so that a semiconductor package unit covered with the transfer molding resin 8 and the heat dissipating fin 6 adhere to each other.

As shown in the structure described above, the grease 5 and the screw 9 are used for bonding between the semiconductor package unit and the heat dissipating fin 6. Further, the bonding surface is required to have high flatness.

Figure 8:
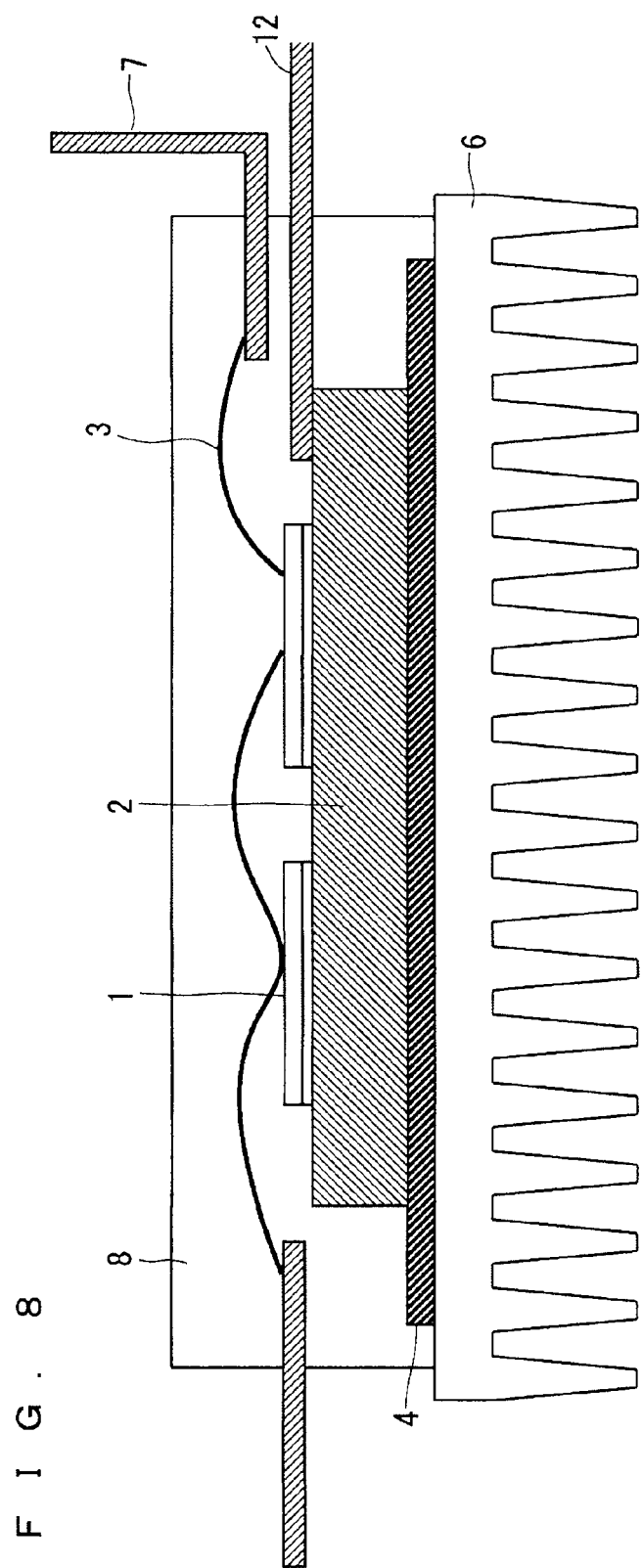

FIG. 8 is a cross-sectional view showing a second semiconductor device according to the underlying technology of the present invention.

Differently from the structure of the semiconductor device shown in FIG. 7, the grease 5 is not provided on the connecting surface between the insulating sheet 4 and the heat dissipating fin 6, and there exists a region in which the transfer molding resin 8 and the heat dissipating fin 6 are directly bonded to each other. As the heat dissipating fin 6, a relatively inexpensive air-cooled heat dissipating fin is used as in the case shown in FIG. 7.

Bonding without the grease 5 reduces components, eliminates the risk of occurrence of voids in the grease, and omits the step of applying the grease 5, which enables miniaturization and cost reduction of a device. In addition, the transfer molding resin 8 and the heat dissipating fin 6 can be formed integrally by press-contact or the like. Further, it is possible to obtain a semiconductor device that has a low thermal resistance and is operable at a high temperature.

Figure 9:
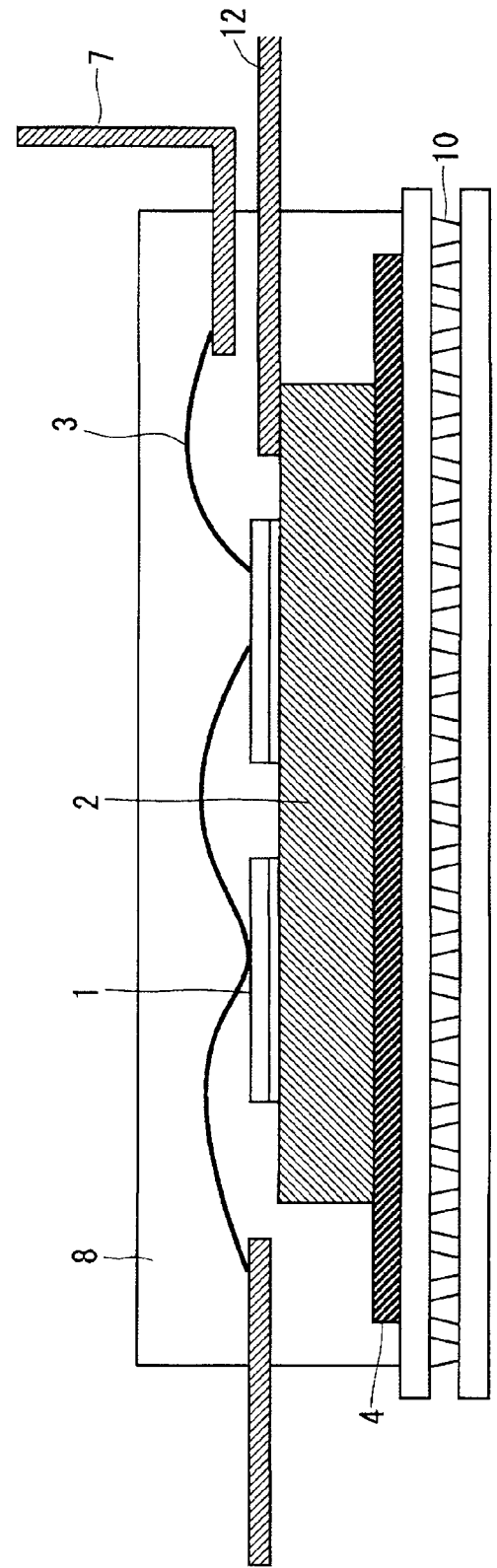

FIG. 9 is a cross-sectional view showing a third semiconductor device according to the underlying technology of the present invention.

Differently from the structure of the semiconductor device shown in FIG. 8, a heat dissipating fin 10 is a water-cooled heat dissipating fin.

With the use of the water-cooled heat dissipating fin 10, the device can be miniaturized. Note that it is possible to appropriately change a heat dissipating fin between the air-cooled one and water-cooled one in accordance with, for example, the use of the semiconductor device.

Even the semiconductor device having the above-mentioned configuration is incapable of obtaining sufficiently high adhesion between the semiconductor package unit (including power elements 1, heat spreader 2 that is, for example, bonded to the power elements 1, and heat insulating sheet 4) and the heat dissipating fin, and accordingly sufficient heat dissipation is difficult to obtain.

Preferred embodiments below describe semiconductor devices capable of enhancing the adhesion between a semiconductor package unit and a heat dissipating fin and enhancing heat dissipation sufficiently by a simple method.

A. FIRST PREFERRED EMBODIMENT

A-1. Configuration

Figure 1:
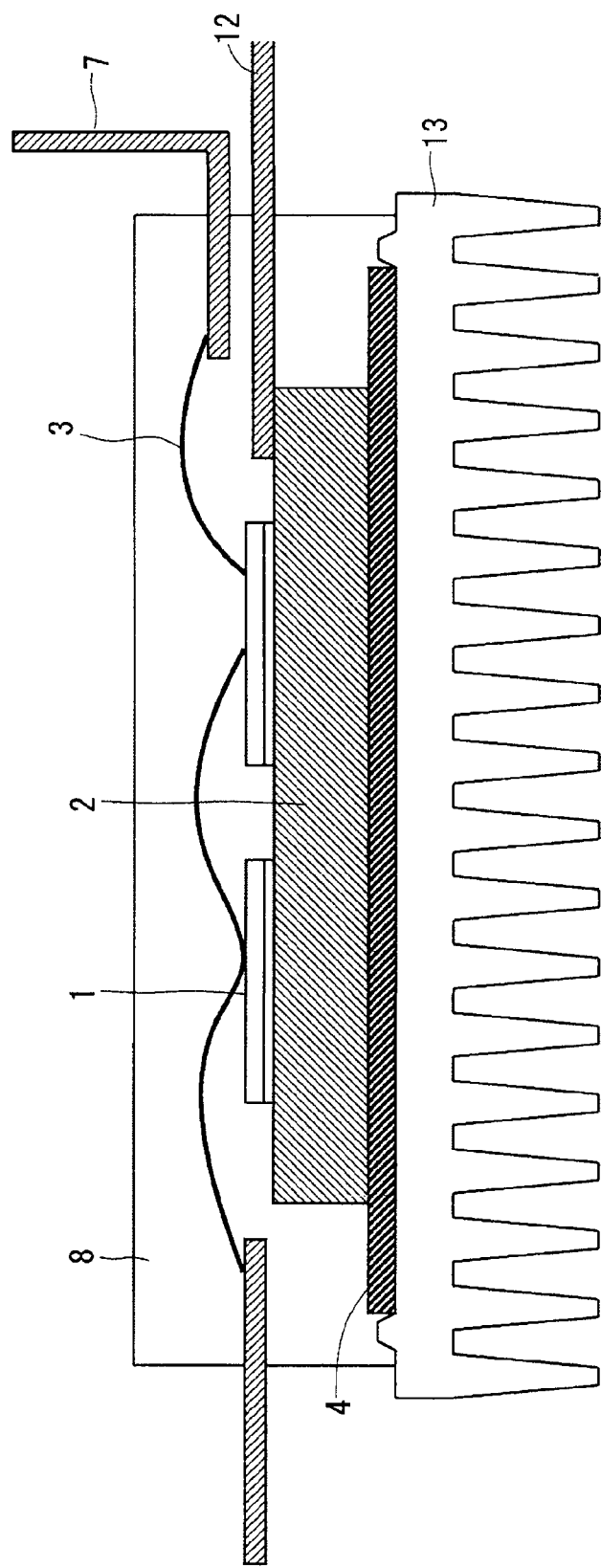
FIGS. 1 and 2 are cross-sectional views of a semiconductor device according to a first preferred embodiment.

FIG. 1 is a cross-sectional view showing a semiconductor device according to a first preferred embodiment of the present invention. As shown in FIG. 1, in the semiconductor device, power elements 1 are provided on a heat spreader 2 and are respectively connected to a signal terminal 7 and a main terminal 12 via aluminum wires 3. As the power element 1, for example, SiC that is a wide bandgap semiconductor can be used in the preferred embodiment below as well. The heat spreader 2 is disposed on an insulating sheet 4, and further, the insulating sheet 4 is directly bonded to a heat dissipating fin 13. The insulating sheet 4 is bonded to the upper surface of the heat dissipating fin 13, with a part of the upper surface thereof being exposed.

A surface including the part of the upper surface of the heat dissipating fin 13, the power elements 1, the heat spreader 2, the aluminum wires 3 and the insulating sheet 4 are covered with a transfer molding resin 8 (epoxy resin).

The upper surface of the heat dissipating surface 13 has a protruding shape formed to surround the insulating sheet 4 such that the edge of the insulating sheet 4 is bound.

The protruding shape is provided on the upper surface of the heat dissipating fin 13 as described above, whereby it is possible to temporarily fix the insulating sheet 4, which improves the accuracy of positioning of the heat dissipating fin 13 and the transfer molding resin 8. Accordingly, it is possible to accurately bond and fix the heat dissipating fin 13 and the transfer molding resin 8 to each other around the insulating sheet 4. This enables to enhance the adhesion between the semiconductor package unit and the heat dissipating fin and enhance heat dissipation.

Figure 2:
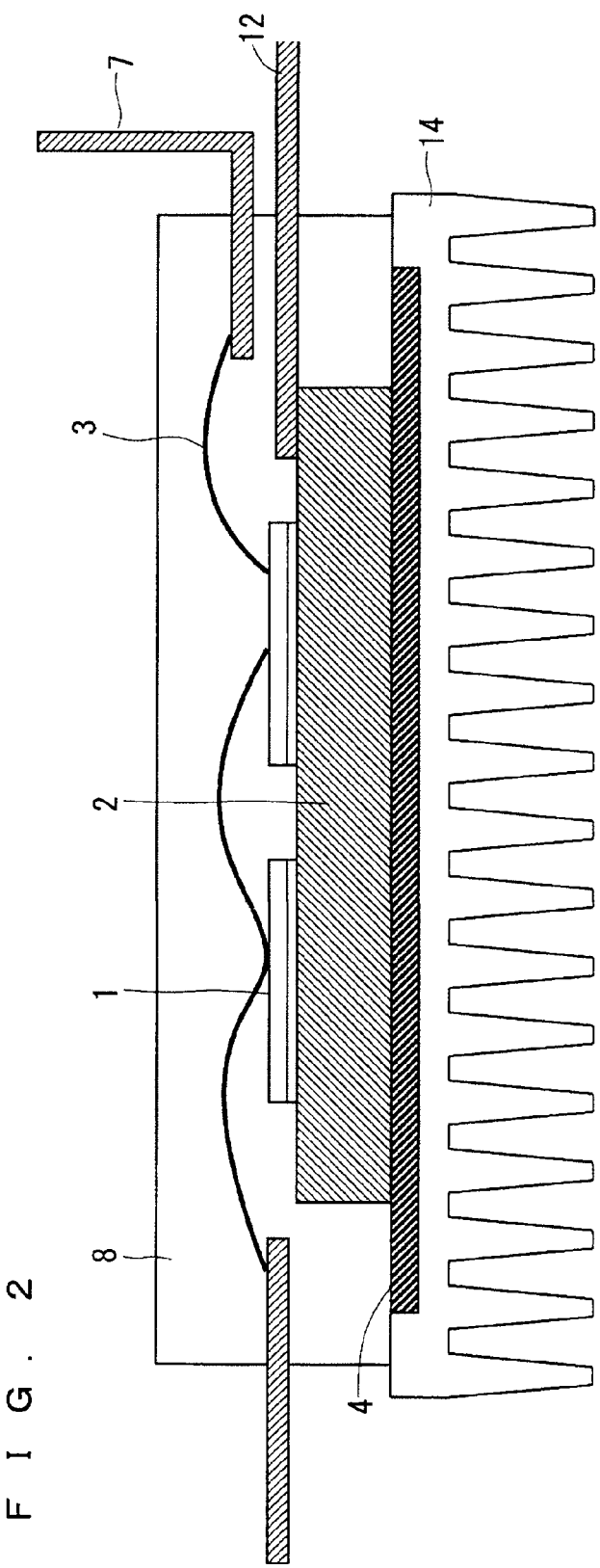

FIG. 2 is a cross-sectional view showing the semiconductor device according to the present invention, which is different from FIG. 1 in that the surface of a heat dissipating fin 14 that is directly bonded to the insulating sheet 4 has a recessed shape and that the insulating sheet 4 is filled in the recessed shape.

The recessed shape in which the insulating sheet 4 is filled allows the insulating sheet 4 to be temporarily fixed, which improves the accuracy of positioning of the heat dissipating fin 14 and the transfer molding resin 8. Accordingly, it is possible to accurately bond and fix the heat dissipating fin 14 and the transfer molding resin 8 to each other around the insulating sheet 4. This enables to enhance the adhesion between the semiconductor package unit and the heat dissipating fin and enhance heat dissipation.

Note that a protruding shape shown in FIG. 1 may be further provided to the heat dissipating fin 14 shown in FIG. 2.

FIG. 3 is a partial cross-sectional view showing the semiconductor device according to the present invention, which is different from FIG. 2 in that the surface (upper surface) of a heat dissipating fin 15 that is directly bonded to the insulating sheet 4 has a recessed shape, and that the inner side surface thereof that is bonded to the transfer molding resin 8 has a concavo-convex shape. In some cases, a protruding shape may be formed on the upper surface of the heat dissipating fin 15 in this structure.

The concavo-convex shape is provided on the inner side surface of the heat dissipating fin 15 that is bonded to the transfer molding resin 8 as described above, which enables to enhance the adhesion between the heat dissipating fin 15 and the transfer molding resin 8 and enhance heat dissipation.

Figure 4:
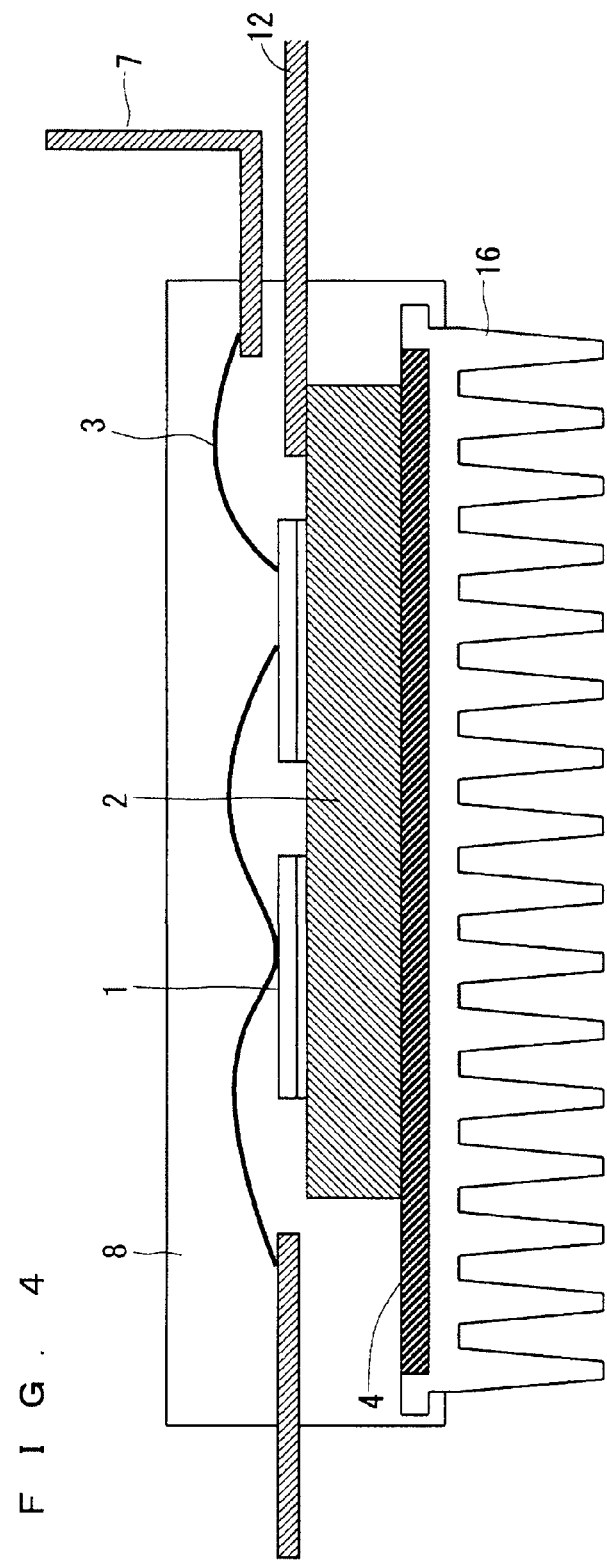
FIG. 4 is another cross-sectional view of the semiconductor device according to the first preferred embodiment.

FIG. 4 is a cross-sectional view showing the semiconductor device according to the present invention, which is different from FIG. 2 that the outer side surface of a heat dissipating fin 16 that is bonded to the transfer molding resin 8 has a protruding shape and that the side surface of the heat dissipating fin 16 is covered with the transfer molding resin 8. That is, there is provided such a structure that the transfer molding resin 8 has a width larger than the width of the heat dissipating fin 16 and covers the side surfaces of the heat dissipating fin 16. In some cases, the structure may be such that a protruding shape or a concavo-convex shape may be formed on the upper surface of the heat dissipating fin 16.

The width of the transfer molding resin 8 is set to be larger than the width of the heat dissipating fin 16 as described above, which facilitates securing the creepage distance and clearance (insulation distance) and makes sure the bonding of the transfer molding resin 8 and the heat dissipating fin 16. Accordingly, it is possible to obtain a semiconductor device that has high reliability as well as long life.

Note that in some cases, a concavo-convex shape or the like may be formed in the structure shown in FIG. 4, similarly to the heat dissipating fin 15 shown in FIG. 3.

Figure 5:
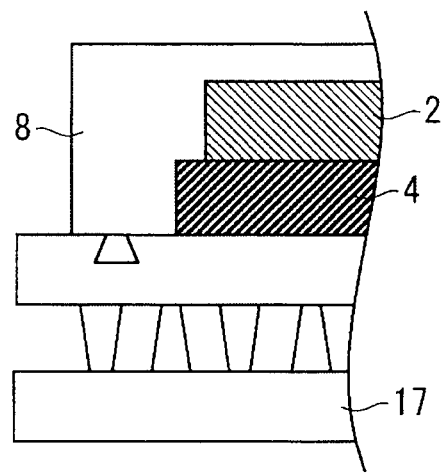
FIG. 5 is another partial cross-sectional view of the semiconductor device according to the first preferred embodiment.

FIG. 5 is a partial cross-sectional view showing the semiconductor device according to the present invention, which is different from FIG. 1 in that a hole is formed on the surface of a heat dissipating fin 17 that is bonded to the transfer molding resin 8 and that the transfer molding resin 8 is filled in the hole for bonding therebetween.

The hole is formed on the surface to be bonded to the transfer molding resin 8, and the heat dissipating fin 17 and the transfer molding resin 8 are bonded to each other in this manner, which enhances the adhesion therebetween as well as heat dissipation. Note that it is possible to appropriately select the formation of a concavo-convex shape on the side surface of the heat dissipating fin or the formation of a concavo-convex shape on the upper surface thereof.

Further, the heat dissipating fin 17 is shown as water-cooled one in FIG. 5, which may be air-cooled one.

A-2. Effects

According to the first preferred embodiment of the present invention, the semiconductor device includes the heat dissipating fin 13, 14; the insulating sheet 4 bonded to the upper surface of the heat dissipating fin 13, 14, with a part of the upper surface being exposed; the heat spreader 2 located on the insulating sheet 4; the power element 1 located on the heat spreader 2; and the transfer molding resin 8 formed to cover a predetermined surface including the upper surface of the heat dissipating fin 13, 14, the insulating sheet 4, the heat spreader 2 and the power element 1, wherein the upper surface of the heat dissipating fin 13, 14 has a protruding shape and/or recessed shape located so as to bind the edge of the insulating sheet 4. Accordingly, it is possible to temporarily fix the insulating sheet 4, which improves the accuracy in positioning and fixing the heat dissipating fin 13 and the transfer molding resin 8. This enables to enhance the adhesion between the semiconductor package unit and the heat dissipating fin and enhance heat dissipation.

Further, according to the first preferred embodiment of the present invention, in the semiconductor device, the heat dissipating fin 15, 16 includes an inner and/or outer side surface covered with the transfer molding resin 8, the side surface having a protruding shape and/or recessed shape. Accordingly, the accuracy in positioning and fixing the heat dissipating fin and the transfer molding resin 8 can be improved by anchor effects. This enables to enhance the adhesion between the semiconductor package unit and the heat dissipating fin and enhance heat dissipation. Therefore, it is possible to improve the reliability of the device and extend the device life.

Further, according to the first preferred embodiment of the present invention, in the semiconductor device, the heat dissipating fin 17 is a water-cooled heat dissipating fin. Therefore, the device can be miniaturized as well as slimmed down.

Further, according to the first preferred embodiment of the present invention, in the semiconductor device, the transfer molding resin 8 has a width larger than the width of the heat dissipating fin 16 so as to cover both side surfaces of the heat dissipating fin 16. This enables to easily secure the creepage distance and clearance (insulation distance) between the main terminal 12 and the heat dissipating fin 16 and make sure the bonding between the transfer molding resin 8 and the heat dissipating fin 16, whereby it is possible to obtain a semiconductor device that has high reliability and long life.

B. SECOND PREFERRED EMBODIMENT

B-1. Configuration

Figure 6:
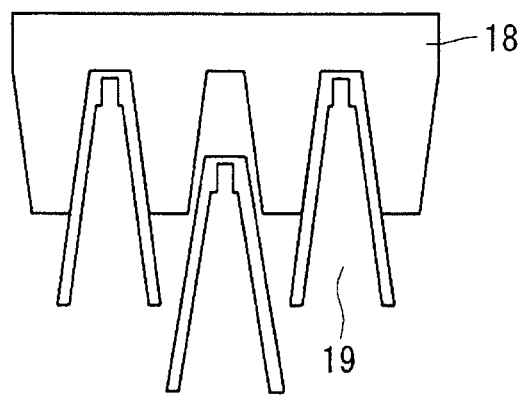
FIG. 6 is a view partially showing the shape of a semiconductor device according to a second preferred embodiment.

FIG. 6 is a partial cross-sectional view showing a semiconductor device according to a second preferred embodiment of the present invention. As partially shown in FIG. 6, the semiconductor device has the structure in which a heat dissipating fin 18 is provided as a first fin and a heat dissipating fin 19 is further provided as a second fin, the heat dissipating fin 19 being fixed and added to the heat dissipating fin 18 in a caulked shape. The other configuration is similar to that of the first preferred embodiment, and thus detailed description thereof is omitted.

In this case, the heat dissipating fin 18 is, for example, a water-cooled one, and includes a fin having a caulked shape as shown in FIG. 6. Accordingly, even in a case where a heat dissipating fin needs to be added further for enhancing the heat dissipation function, the heat dissipating fin 19 can be bonded to the heat dissipating fin 18 with ease by being fitted in a caulked shape, which makes it possible to achieve the heat dissipating function.

B-2. Effects

According to the second preferred embodiment of the present invention, in the semiconductor device, the heat dissipating fins include the heat dissipating fin 18 as a first fin and the heat dissipating fin 19 as a second fin fixed in a caulked shape. Therefore, it is possible to easily bond the heat dissipating fin 19 to the heat dissipating fin 18 by being fitted in a caulked shape to realize the heat dissipating function also in a case where a heat dissipating fin is required to be further added for enhancing the heat dissipating function.

The outer shape of the semiconductor device is limited by a mold of a molding machine. Therefore, even if there are demands for enhanced heat dissipation in the market, it is difficult to change the outer shape of a device for obtaining a semiconductor device having the heat property required for satisfying the demands in the market. In such a case, the structure of the present invention enables to achieve enhanced heat dissipation.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   at least one heat dissipating fin element having at least one fin, wherein an upper surface of said at least one heat dissipating fin element has a protruding shape and/or recessed shape;
   an insulating sheet bonded to the upper surface of said at least one heat dissipating fin element, wherein the insulating sheet is provided at the upper surface of said at least one heat dissipating fin element at a position such that said protruding shape and/or recessed shape engages and binds an edge of said insulating sheet to fix the position of the insulating sheet on the upper surface of said at least one heat dissipating fin element, and wherein a part of the upper surface of said at least one heat dissipating fin element is exposed;
   a heat spreader located on said insulating sheet;
   a power element located on said heat spreader; and
   a transfer molding resin located to cover a predetermined surface including said part of the upper surface of said at least one heat dissipating fin element, said insulating sheet, said heat spreader and said power element.

2. The semiconductor device according to claim 1, wherein said at least one heat dissipating fin element includes an inner and/or outer side surface covered with said transfer molding resin, said side surface having a protruding shape and/or recessed shape.

3. The semiconductor device according to claim 1, wherein said at least one heat dissipating fin element is a water-cooled fin element.

4. The semiconductor device according to claim 1, wherein said power element is an element including a wide bandgap semiconductor.

5. The semiconductor device according to claim 1, wherein said at least one heat dissipating fin element comprises a first fin element and a second fin element fixed to said first fin in a caulked shape.

6. The semiconductor device according to claim 1, wherein said transfer molding resin has a width larger than a width of said at least one heat dissipating fin element so as to cover side surfaces of said at least one heat dissipating fin element.

* * * * *